United States Patent
Dimitrov et al.

(10) Patent No.: US 9,733,391 B2
(45) Date of Patent: Aug. 15, 2017

(54) METHOD AND SYSTEM FOR GEOPHYSICAL MODELING OF SUBSURFACE VOLUMES

(71) Applicants: Pavel Dimitrov, Houston, TX (US); Matthias Imhof, Katy, TX (US); Martin Terrell, Spring, TX (US); John S. Lien, The Woodlands, TX (US)

(72) Inventors: Pavel Dimitrov, Houston, TX (US); Matthias Imhof, Katy, TX (US); Martin Terrell, Spring, TX (US); John S. Lien, The Woodlands, TX (US)

(73) Assignee: ExxonMobil Upstream Research Company, Houston, TX (US)

( * ) Notice: Subject to any disclaimer, the term of this patent is extended or adjusted under 35 U.S.C. 154(b) by 754 days.

(21) Appl. No.: 14/185,828

(22) Filed: Feb. 20, 2014

(65) Prior Publication Data
US 2014/0278311 A1    Sep. 18, 2014

Related U.S. Application Data

(60) Provisional application No. 61/799,000, filed on Mar. 15, 2013.

(51) Int. Cl.
*G06G 7/48* (2006.01)
*G01V 99/00* (2009.01)
(Continued)

(52) U.S. Cl.
CPC ............ *G01V 99/005* (2013.01); *G01V 1/282* (2013.01); *G01V 2210/641* (2013.01); *G01V 2210/66* (2013.01); *G06F 17/50* (2013.01)

(58) Field of Classification Search
None
See application file for complete search history.

(56) References Cited

U.S. PATENT DOCUMENTS

| 5,416,750 A | 5/1995 | Doyen et al. |
|---|---|---|
| 5,444,619 A | 8/1995 | Hoskins et al. |

(Continued)

FOREIGN PATENT DOCUMENTS

| WO | WO 99/64896 | 12/1999 | |
|---|---|---|---|
| WO | WO 2007/061744 | 5/2007 | |
| WO | WO 2012078217 A1 * | 6/2012 | ............ G06T 17/05 |

OTHER PUBLICATIONS

White, C.D. et al., "Translating Outcrop Data to Flow Models, with Applications to the Ferron Sandstone", Aug. 1999, SPE Annual Technical Conference and Exhibition, SPE Reservoir Eval. & Eng. (4).*

(Continued)

*Primary Examiner* — Cedric D Johnson
(74) *Attorney, Agent, or Firm* — ExxonMobile Upstream Research-Law Department

(57) ABSTRACT

Method and system is described for modeling one or more geophysical properties of a subsurface volume. In one embodiment, a method of modeling the subsurface comprises obtaining one or more subsurface volume and obtaining an interpretation of the subsurface volume. One or more flexible geologic concepts are defined and applied to the interpretation of the subsurface volume. The one or more geologic concepts comprise one or more flexible geologic concepts. A modified interpretation of the subsurface volume is obtained based upon the applied geologic concepts.

4 Claims, 8 Drawing Sheets

(51) Int. Cl.
*G01V 1/28* (2006.01)
*G06F 17/50* (2006.01)

(56) References Cited

U.S. PATENT DOCUMENTS

| | | | |
|---|---|---|---|
| 5,539,704 A | 7/1996 | Doyen et al. |
| 5,586,082 A | 12/1996 | Anderson et al. |
| 5,677,893 A | 10/1997 | de Hoop et al. |
| 5,852,588 A | 12/1998 | de Hoop et al. |
| 5,920,319 A | 7/1999 | Vining et al. |
| 5,940,777 A | 8/1999 | Keskes |
| 6,052,650 A | 4/2000 | Assa et al. |
| 6,226,596 B1 | 5/2001 | Gao |
| 6,236,942 B1 | 5/2001 | Bush |
| 6,295,504 B1 | 9/2001 | Ye et al. |
| 6,411,903 B2 | 6/2002 | Bush |
| 6,574,565 B1 | 6/2003 | Bush |
| 6,618,678 B1 | 9/2003 | Van Riel |
| 6,625,541 B1 | 9/2003 | Shenoy et al. |
| 6,725,163 B1 | 4/2004 | Trappe et al. |
| 6,735,526 B1 | 5/2004 | Meldahl et al. |
| 6,754,380 B1 | 6/2004 | Suzuki et al. |
| 6,754,589 B2 | 6/2004 | Bush |
| 6,757,614 B2 | 6/2004 | Pepper et al. |
| 6,771,800 B2 | 8/2004 | Keskes et al. |
| 6,801,858 B2 | 10/2004 | Nivlet et al. |
| 6,804,609 B1 | 10/2004 | Brumbaugh |
| 6,847,895 B2 | 1/2005 | Nivlet et al. |
| 6,882,997 B1 | 4/2005 | Zhang et al. |
| 6,941,228 B2 | 9/2005 | Toelle |
| 6,950,786 B1 | 9/2005 | Sonneland et al. |
| 6,957,146 B1 | 10/2005 | Taner et al. |
| 6,970,397 B2 | 11/2005 | Castagna et al. |
| 6,988,038 B2 | 1/2006 | Trappe et al. |
| 7,006,085 B1 | 2/2006 | Acosta et al. |
| 7,092,824 B2 | 8/2006 | Favret et al. |
| 7,098,908 B2 | 8/2006 | Acosta et al. |
| 7,162,463 B1* | 1/2007 | Wentland ............ G01V 11/00 706/12 |
| 7,203,342 B2 | 4/2007 | Pedersen |
| 7,206,782 B1 | 4/2007 | Padgett |
| 7,222,023 B2 | 5/2007 | Laurent et al. |
| 7,243,029 B2 | 7/2007 | Lichman et al. |
| 7,248,258 B2 | 7/2007 | Acosta et al. |
| 7,248,539 B2 | 7/2007 | Borgos et al. |
| 7,266,041 B1 | 9/2007 | Padgett |
| 7,295,930 B2 | 11/2007 | Dulac et al. |
| 7,453,766 B1 | 11/2008 | Padgett |
| 7,453,767 B1 | 11/2008 | Padgett |
| 7,463,552 B1 | 12/2008 | Padgett |
| 7,502,026 B2 | 3/2009 | Acosta et al. |
| 7,697,373 B1 | 4/2010 | Padgett |
| 7,881,501 B2 | 2/2011 | Pinnegar et al. |
| 8,010,294 B2 | 8/2011 | Dorn et al. |
| 8,027,517 B2 | 9/2011 | Gauthier et al. |
| 8,055,026 B2 | 11/2011 | Pedersen |
| 8,065,088 B2 | 11/2011 | Dorn et al. |
| 8,121,969 B2 | 2/2012 | Chan et al. |
| 8,219,322 B2 | 7/2012 | Monsen et al. |
| 8,326,542 B2 | 12/2012 | Chevion et al. |
| 8,346,695 B2 | 1/2013 | Peper et al. |
| 8,358,561 B2 | 1/2013 | Kelly et al. |
| 8,363,959 B2 | 1/2013 | Boiman et al. |
| 8,380,435 B2 | 2/2013 | Kumaran et al. |
| 8,385,603 B2 | 2/2013 | Beucher et al. |
| 8,463,551 B2 | 6/2013 | Aarre |
| 8,515,678 B2 | 8/2013 | Pepper et al. |
| 2008/0123469 A1 | 5/2008 | Wibaux et al. |
| 2008/0143718 A1 | 6/2008 | Ray et al. |
| 2008/0270033 A1 | 10/2008 | Wiley et al. |
| 2009/0003511 A1 | 1/2009 | Roy et al. |
| 2010/0174489 A1 | 7/2010 | Bryant et al. |
| 2010/0211363 A1 | 8/2010 | Dorn et al. |
| 2010/0245347 A1 | 9/2010 | Dorn et al. |
| 2011/0018985 A1 | 1/2011 | Zhu |
| 2011/0048731 A1 | 3/2011 | Imhof et al. |
| 2011/0307178 A1 | 12/2011 | Hoekstra |
| 2012/0029828 A1* | 2/2012 | Pepper ............... G01V 1/301 702/16 |
| 2012/0072116 A1 | 3/2012 | Dorn et al. |
| 2012/0090001 A1 | 4/2012 | Yen |
| 2012/0117124 A1 | 5/2012 | Bruaset et al. |
| 2012/0150447 A1 | 6/2012 | Van Hoek et al. |
| 2012/0195165 A1 | 8/2012 | Vu et al. |
| 2012/0197530 A1 | 8/2012 | Posamentier et al. |
| 2012/0197531 A1 | 8/2012 | Posamentier et al. |
| 2012/0197532 A1 | 8/2012 | Posamentier et al. |
| 2012/0197613 A1* | 8/2012 | Vu .................. G01V 1/30 703/6 |
| 2012/0257796 A1 | 10/2012 | Henderson et al. |
| 2012/0322037 A1 | 12/2012 | Raglin |
| 2013/0006591 A1 | 1/2013 | Pyrcz et al. |
| 2013/0138350 A1 | 5/2013 | Thachaparambil et al. |
| 2013/0144571 A1 | 6/2013 | Pepper et al. |
| 2013/0158877 A1 | 6/2013 | Bakke et al. |

OTHER PUBLICATIONS

Zeng, H. et al. (1998), "Stratal slicing, part II: real seismic data," *Geophysics* 63(2), pp. 514-522.
U.S. Appl. No. 61/740,352, filed Dec. 20, 2012, Dimitrov.
U.S. Appl. No. 61/740,353, filed Dec. 20, 2012, Dimitrov et al.
U.S. Appl. No. 61/740,354, filed Dec. 20, 2012, Dimitrov et al.
U.S. Appl. No. 61/740,358, filed Dec. 20, 2012, Dimitrov et al.

* cited by examiner

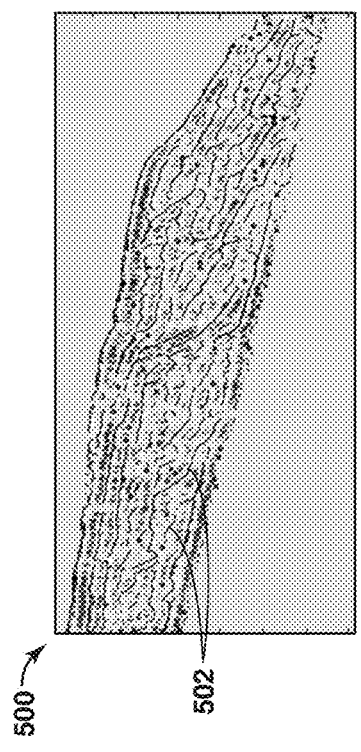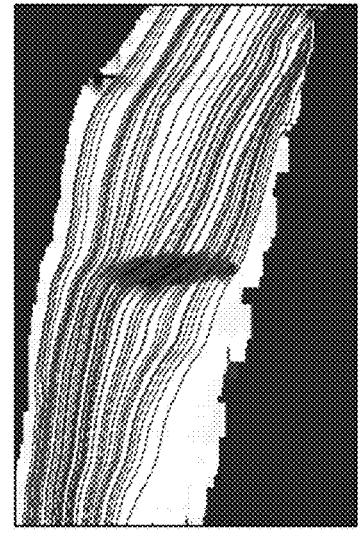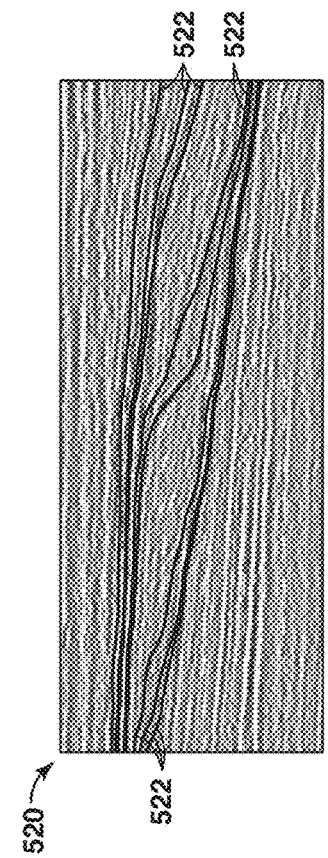

METHOD AND SYSTEM FOR GEOPHYSICAL MODELING OF SUBSURFACE VOLUMES

CROSS-REFERENCE TO RELATED APPLICATION

This application claims the benefit of U.S. Provisional Patent Application 61/799,000, filed Mar. 15, 2013, entitled METHOD AND SYSTEM FOR GEOPHYSICAL MODELING OF SUBSURFACE VOLUMES, the entirety of which is incorporated by reference herein.

FIELD OF THE INVENTION

This invention relates generally to the field of prospecting and more particularly to data processing. Specifically, the invention is a method for modeling subsurface volumes for one or more geophysical properties.

BACKGROUND OF THE INVENTION

In the oil and gas industry, modeling of the subsurface is typically utilized for visualization and to assist with analyzing the subsurface volume for potential locations for hydrocarbon resources. Accordingly, various methods exist for estimating the geophysical properties of the subsurface volume (e.g., information in the model domain) by analyzing the recorded measurements from receivers (e.g., information in the data domain) provided that these measured data travel from a source, then penetrate the subsurface volume represented by a subsurface model in model domain, and eventually arrive at the receivers. The measured data carries some information of the geophysical properties that may be utilized to generate the subsurface model.

Traditional interpretation systems in the geosciences are product oriented instead of process oriented. The interpreter typically loads some data for a hard disk, performs an interpretation process on this data, and stores the result on disk. What are stored are the outputs or products that may become inputs for later interpretation step or processes. After lengthy manual interpretation steps, the detailed relations between different products are not captured. At times, even the provenance of a product may not be captured, which may be a result of inconsistencies between products. Accordingly, to prevent the loss of valuable information, the data is accumulated instead of being deleted. Further, one or more interpreters may repeat the same interpretation step because an underlying input changed or details were not captured. That is, conventional interpretation processes are not efficient.

As an example, an interpreter may select a horizon in a manual, assisted or automated manner for a typical seismic interpretation system. Depending on horizon prominence and data quality, the interpreter may spend a few minutes to one or more weeks on one horizon. Then, the interpreter picks a second and a third horizon, which may involve similar time periods for analysis. While picking the third horizon, the interpreter may encounter an issue where the third horizon intersects the second one. Clearly, this intersection violates expectations or the law of stratigraphic superposition. At this point, the interpreter has to determine whether the problem is with the second horizon or third horizon and attempts to correct the situation by editing and reinterpreting the horizons in a manual or computer-assisted manner. However, the editing may result in intersections with other horizons. In conventional interpretation systems, numerous interpretation objects, such as surfaces or faults, are generated and stored independently from each other. These inconsistencies between the interpretation objects may remain undetected and cascade through multiple interpretation products until identified, which may require determining the root cause of the inconsistencies and/or recreating the interpretation products.

These problems are further evident in seismic interpretation systems that involve pattern recognition techniques. Typically, interpreters learn about certain patterns, which are used along with experience to identify patterns in the measurement data. Yet, the nature of many patterns do not become concrete or formal enough to be identified and recorded and, as a result, experience is not captured. This also hinders the building of an automated pattern recognition system, as there is no natural language in which to exchange information on appropriate levels of abstraction. There is a gap between the descriptions provided by experienced interpreters and the descriptions required to instruct a computer.

As the recovery of natural resources, such as hydrocarbons rely, in part, on a subsurface model, a need exists to enhance subsurface models of one or more geophysical properties. In particular, a need exists to enhance the seismic interpretation systems to be able to instruct a computer how to find patterns in data and allows to describe those patterns in a manner that is abstract enough to hide many of the technical detail.

SUMMARY OF THE INVENTION

One embodiment of the present disclosure is a method of modeling the subsurface comprising: (a) obtaining one or more subsurface volume; (b) obtaining an interpretation of the subsurface volume; (c) defining one or more one or more flexible geologic concepts; (d) applying, by a computer system, one or more geologic concepts to the interpretation of the subsurface volume, wherein the one or more geologic concepts comprise one or more flexible geologic concepts; (e) obtaining a modified interpretation of the subsurface volume based upon the applied geologic concepts.

The foregoing has broadly outlined the features of one embodiment of the present disclosure in order that the detailed description that follows may be better understood. Additional features and embodiments will also be described herein.

BRIEF DESCRIPTION OF THE DRAWINGS

The foregoing and other advantages of the present disclosure may become apparent upon reviewing the following detailed description and drawings of non-limiting examples of embodiments.

FIGS. 5A to 5C are exemplary graphs of computing primitives and the neighbor relations graphs in accordance with an exemplary embodiment of the present techniques.

Figure 1A:
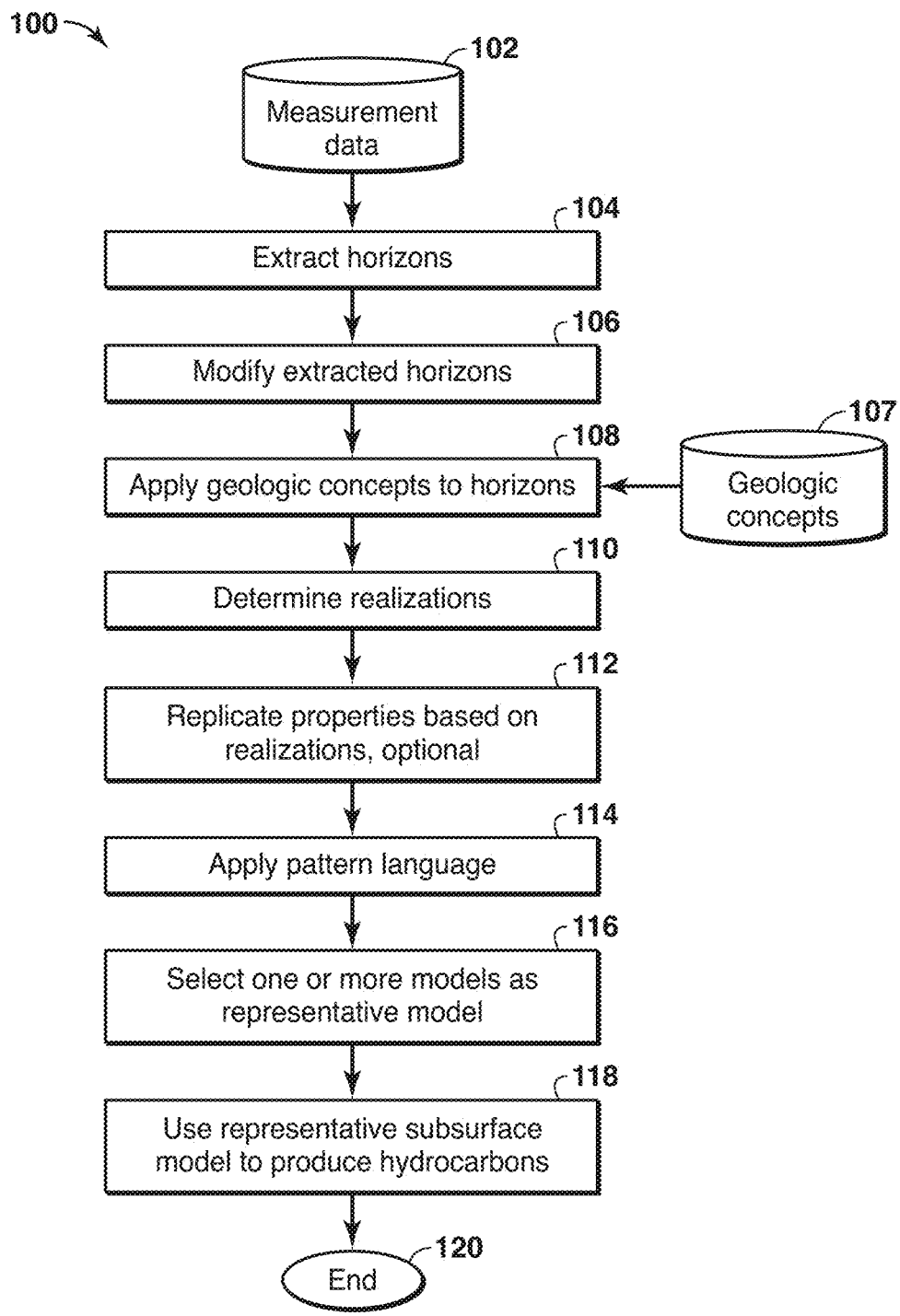
FIGS. 1A and 1B are flow charts for generating a subsurface model in accordance with two exemplary embodiments of the present techniques.

Due to patent law prohibitions on the use of color, drawings that originally used color, such as FIGS. 3A-3B and 5A-5C, have been replaced by black-and-white reproductions.

DETAILED DESCRIPTION OF THE PREFERRED EMBODIMENTS

In the following detailed description section, the specific embodiments of the present disclosure are described in connection with preferred embodiments. However, to the extent that the following description is specific to a particular embodiment or a particular use of the present disclosure, this is intended to be for exemplary purposes only and simply provides a description of the exemplary embodiments. Accordingly, the disclosure is not limited to the specific embodiments described below, but rather, it includes all alternatives, modifications, and equivalents falling within the true spirit and scope of the appended claims.

Various terms as used herein are defined below. To the extent a term used in a claim is not defined below, it should be given the broadest definition persons in the pertinent art have given that term as reflected in at least one printed publication or issued patent. Further, various terms and reference characters that are the same are utilized in the equations and associated description within the disclosure.

The present disclosure describes methods and systems to enhance subsurface models. In particular, the present techniques involve interpreting and analyzing geophysical and geological data using a computer. Unlike current methodology which primarily focuses on obtaining products (e.g., horizons from seismic data, attributes, etc.), the present techniques involve the transformations that obtain those products. Accordingly, the present techniques describe mechanisms to organize the computational steps in a coherent manner that is both flexible and compact.

The present techniques provide various enhancements over other methods. For example, the present techniques track interpretation operations, which include computational and user-guided operations. By tracking the interpretation operations, work can be reproduced exactly step by step, including all intermediate stages. This feature may also provide a mechanism for users to extend or divert from an existing interpretation from any stage, including interpretations created by other users. In addition, portions of an existing interpretation may be utilized as "templates" applied to other interpretation sessions. This feature also provides a mechanism for data mining algorithms to learn from human operators.

Further, the present techniques provide access to multiple users to the same data set and available interpretations, including those created by other users; various stages of interpretations may be available including abandoned leads or concepts. Joint interpretation of different data sets, including multiple types of data with multiple characteristics may also be provided by this functionality.

Also, the present techniques may provide a mechanism to annotate work as well as data. The documenting of the interpretation sessions may include different levels of detail based on the user's discretion. The documentation may include user-selected levels of detail while browsing through an existing interpretation In addition to the above features, the present techniques may provide for an automatic optimization of the computation process that leads to the creation of a product. This may also include the creation, manipulation and evaluation of multiple interpretation scenarios.

The present techniques may combine together different features to form an interpretation system. The process may involve a user loading seismic data. Then, various calculations may be performed, such as computing dip estimates, calculating horizons, or computing stacks of surfaces. The user may then review and/or document the data, such as browsing the data on a cross section of the volume: the user moves the cursor over the data and the surface corresponding to the cursor location follows the movement in real time; marking the location and current surface; and/or identifying and/or correcting surfaces by providing alternative surfaces in a small region or by connecting two points together. If the user wants to identify patterns in the data, the system may utilize a pattern finding operation. Each of these various steps may be performed in operations, such as loading the data, computing vectors, selecting surfaces, updating surfaces and fault, etc., which are stored in memory. The operations may be tracked to recover the state of an earlier step in the interpretation.

In one or more embodiments, a pattern language is utilized to enhance the interpretation of data. The pattern language balances the feature of being formal enough to instruct a computer how to find patterns in data along with the feature of describing patterns in an abstract manner to hide certain technical details. This pattern language may provide a mechanism for technical specialists and non-technical specialists to interact and to define (or refine) pattern definitions and algorithms for use in a pattern recognition interpretation system.

The pattern language provides certain features to enhance the pattern recognition interpretation system. As an example, the pattern language documents work that has been performed. Further, the pattern language describes algorithms to extract patterns, while remaining abstract. Also, the pattern language provides a mechanism to segment the data into logical units that can be further manipulated. Also, the pattern language provides a mechanism to utilize machine learning approaches.

The process may begin by defining what patterns mean within this context and identify specific aspects. The aspects may include i) what patterns are built from, ii) how they are built, and iii) how they may interfere with one another. This is a recursive definition and, as a result, pattern hierarchies may be based on it. Then, with regard to the second aspect, pattern elements may be obtained at the lowest level of the hierarchy (e.g., the measurements) and how they may be combined. Higher order patterns are then described and different techniques are used to combine patterns into larger patterns. As a result, users of a pattern recognition interpretation system based on the proposed language may interact with the patterns at the highest levels in these hierarchies.

In contrast to conventional systems, the present techniques do not generate patterns or compare templates against the measurement data. The present techniques involve collecting portions of the data into coherent structures based on the pattern language, which provides a mechanism to perform this organization. That is, the present techniques do not generate patterns or match data against collections of templates, but utilize the pattern language to manage the identification process.

As an example, in one or more embodiments, the pattern language may include using a pattern as a special type of operation or feature. That is, it may be a compound operation, in that it may consist of a sequence of operations, which does not involve user interaction during execution. The process by which patterns are defined may be preferably through an embodiment of the pattern language in accordance with the present techniques. The pattern language provides various features, such as documenting work; describing algorithms to extract patterns (e.g., this is a specification that affords many implementations and back-end optimization); describing a way to segment data into logical units that can be manipulated further; and providing a mechanism for machine learning approaches. To further describe the present techniques, various aspects are described further in FIGS. 1 to 7.

In current seismic interpretation systems, the interpreter picks a horizon in a manual, assisted or automated manner. Depending on horizon prominence and data quality, the interpreter may spend minutes to weeks on this one horizon. Then, the interpreter decides to pick a second and third horizon. While picking the third horizon, the interpreter encounters the situation that the third horizon is suddenly at the depth of the second one. Clearly, a problem exists that violates expectations or the law of stratigraphic superposition. The interpreter decides that the problem is with the second horizon and attempt to correct the situation with editing and reinterpreting the second horizon manually or computer assistedly. But now, the second horizon interferes with the first one, and so the interpreter is forced to correct the first one, too! The problem with existing interpretation systems is that interpretation objects such as surfaces or faults are generated and stored independently from each other, and thus, inconsistencies require painstaking editing, or worse, remain undetected tainting models further down the line.

What is needed is a system that adjusts previous and future interpretation objects when an edit is made to the interpretation. Preferably, picking or editing is easy without too many mouse clicks (ergonomics), the sequence of interpretation steps are recorded and repeated (multiple scenarios), and different interpreters arrive at the same result when starting from the same point (reproducibility). A functional framework for interpretation captures both intermediate and final interpretations in an implicit manner and satisfies at least all these needs. One embodiment of a functional form is representing the interpretation by a level set where, e.g., surfaces correspond to individual isocontours. Instead of picking or editing individual surfaces, the interpreter generates, edits, or manipulates the level set. An interpretation object extracts some feature from a functional or another object. Given a seed point, a surface object instantiates the surface spawned by the seed point functional. A sequence object is defined by two surface objects and instantiates the package bounded by the two surfaces. When the surfaces change in response to the functional, the sequence changes. The flattening object transforms the seismic data into the stratigraphic domain where all surfaces are flat, etc.

Functional forms can be cascaded. Let's say that the interpreter needs to build horizon attribute maps. In the introductory example, the interpreter will need to recompute the attributes after correcting the surfaces. In a functional framework, the horizons and the associated maps are recomputed and presented in real time. Let's say the interpreter wants to plan a well from a given surface location into a high-amplitude anticline. If one of the surfaces in the interpretation needs change, surfaces, maps, and well path may need to be redone. Thus, a functional framework for interpretation allows setting up (hierarchical) dependencies between interpretation products that induce changes in results further down the chain. Potentially, the functional framework can be extended upstream into data processing and downstream into reservoir simulation, where, for example, a change in the migration velocities changes the estimated ultimate recovery of a field. An obvious extension is to use these surfaces in a geologic model that automatically adapts flow units and reservoir parameters such as porosity or permeability when the interpreter modifies the functional (modeling while interpreting).

While this may sound unattainable, we already have a two-dimensional prototype that uses a functional form to represent surfaces and faults, as well as certain patterns such as a thin segment that thickens and thins again, for example a prograding system tract. The prototype not only allows the interpreter to generate quickly at least one interpretation (time reduction, ergonomics), but also seduces the interpreter to play and explore different scenarios and hypothesis (multiple scenarios). Moreover, we are currently working on a three-dimensional prototype to explore the possibility of such a revolutionary interpretation system.

The presented use case is interpretation of one seismic volume, maybe in conjunction with additional collocated derived volumes. Such a system is highly editable, robust in a variety of environments and business stages, and enables real-time (remote) collaboration because only the sequence of interpretation steps or edits need to be exchanged. The system is simple in that the interpreter may interact with the seismic data in a direct and intuitive manner with the necessary modifications to the functional occurring in the background in a manner that is transparent to the user.

Further extensions include knowledge capture, scenario generation, or the joint interpretation of truly different datasets. Knowledge capture refers to the recording of the sequence of interpretation steps and labeling of the resulting geophysical or geologic feature. Over time, a database of features and their derivation can be assimilated that can be examined or mined for training and research. Scenario generation builds upon such a database that is queried for similar features. The interpretation system could mine the database to suggest likely features or concepts that were not anticipated by the interpreter. Moreover, the database or a geologic model could also be used to impose an expected concept into an interpretation, for example to fill a no-data zone with a concept. A last exemplary application is the joint interpretation of differing datasets. Instead of using one single functional, we may use a different one for every dataset and define additional functionals that serve as transforms or mappings between the different ones. A first example is tying multiple wells where each well has a functional that maps between depth and travel time (i.e., the time-depth curve) and the fundamental functional expressing the implied horizons between the wells. Another example is the simultaneous interpretation of time- and depth-migrated data. Each domain has its own fundamental functional as described above that are linked by a (vector-valued) functional that maps between the domains. The interpreter selects a seed point in the time domain data that instantiates a surface. Simultaneously, this seed point is transferred to the depth domain where a surface is instantiated in the depth domain. In case of inconsistencies, the interpreter may edit either the fundamental form in whichever domain, or edit the transformation instead.

Figure 1B:
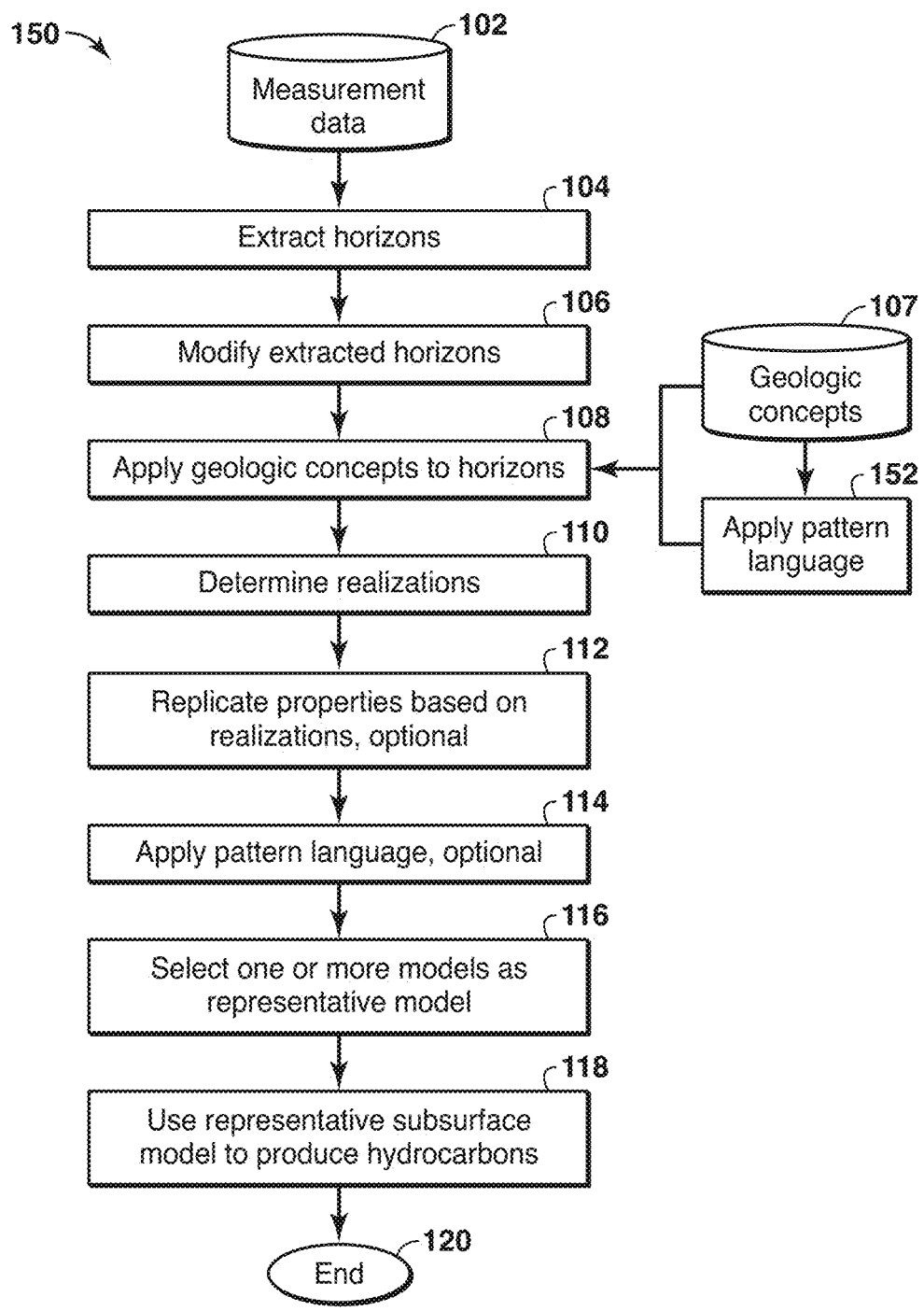

Certain embodiments of the present techniques may be implemented as a method, as described in the exemplary embodiments of flow charts in FIGS. 1A and 1B. FIG. 1A is a flow chart 100 for generating a subsurface model in accordance with an exemplary embodiment of the present techniques. As noted above, this flow chart 100 includes a data preparation stage, which includes blocks 102, 104 and 106, and an interpretation stage, which includes blocks 108 to 116. Further, the resulting subsurface model may be utilized to produce hydrocarbons as shown in block 118 and the process may be completed in block 120.

The process begins with the data preparation stage, which involves constructing data volumes from the measurement data, as shown in blocks 102 to 106. The measurement data is obtained in block 102. The measurement data may be obtained by performing a seismic survey (e.g., forming seismic waves with a source, recording the received signals related to the source at one or more receivers, and processing received data to form measurement data). The measurement data may include surface seismic data, check-shot seismic data, etc. Also, the measurement data may include controlled source electromagnetic data, microseismic and/or other types of measured data. Each of these different surveys may be performed in a manner known to those skilled in the art. This measurement data may be subjected to various processing steps to remove noise and/or other filtering to refine the measurement data. With the measurement data, horizons are extracted in block 104. The extraction of the horizons may include forming a subsurface model with horizons indicated. The extraction of horizons may include constructing a data volume set based on the measurement data (e.g., measurement data used to populate the different nodes or cells within the data volume set or subsurface model), optionally performing label propagation, forming a stack of surfaces and extracting horizons from the measurement data, stack of surface, and/or data derived from the measurement data. The method may include performing vector calculations from measurement data (e.g., seismic data). As an example, the horizon extraction may include the techniques described in U.S. Patent Application Ser. Nos. 61/740,358; 61/740,352; 61/740,353; and 61/740,354, which are each hereby incorporated by reference herein. The measurement data may include data volumes, such as an image and/or a property volume of one or more geophysical properties, such as density, porosity, seismic velocity (vs), pressure velocity (vp), fluid saturation, and the like. The data volume may include any number of volumes and may include one or more attribute volumes, instantaneous phase volumes, amplitude volumes, other attribute volumes, and any combination of such volumes. At block 106, the extracted horizons may be modified. The modification of the extracted horizons may include modifying the number of horizons within the model. In such an embodiment, the stack of surfaces that was used to extract the horizon may itself be updated. Said differently, the horizon extraction process may affect subsequent horizon extractions.

Once the horizons are extracted, the interpretation stage, which includes blocks 108 to 116, may be performed. The interpretation stage begins by applying the geologic concepts to the horizons, as noted in block 108. The geologic concepts, as noted in block 107, may include stacking patterns (e.g., how surfaces (horizons) of different types interact when they meet (truncation modalities)). Another type of geologic concept may involve the interpolation operation for missing surfaces (e.g., proportional, top-conformal, base-conformal, etc.). As used herein, a flexible geologic concept is a concept that is added on an as-needed basis by a user employing the pattern language. These types of concepts are the result of human interpretation, but the system uses the information to facilitate the application of the concepts (e.g., to build a geologic framework).

Then, at block 110, one or more realizations are determined. Then, properties may be assigned or replicated based on one or more of the realizations, as shown in block 112. The assignment or replication of properties based on the realization may include, but is not limited to, the measured or estimated properties at a well location or, in general, an isolated location in the volume being propagated to a region defined by two or more interpreted horizons. Each realization provides a version of such horizons, so the replication of the properties may have a different effect for each realization. Then, the pattern language may be applied to the realization or replicated properties, as shown in block 114. The application of the pattern language may include performing a pattern search on geometry or attributes, for example. The application of pattern language is described further below in FIGS. 3A, 3B, 4 and 5. Once the pattern language has been applied, one or more models may be selected as a representative model, as shown in block 116. The selection of the one or more models may include determining which of the models satisfies a cost function or a manual selection performed by a human interpreter.

Once the interpretation stage is complete, the representative models may be utilized to produce hydrocarbons, as noted in block 118. The subsurface model may be utilized in hydrocarbon management activities to determine locations of resources, to access the resources and produce hydrocarbons in a manner known to those skilled in the art. Disclosed aspects may be used in hydrocarbon management activities. As used herein, "hydrocarbon management" or "managing hydrocarbons" includes hydrocarbon extraction, hydrocarbon production, hydrocarbon exploration, identifying potential hydrocarbon resources, identifying well locations, determining well injection and/or extraction rates, identifying reservoir connectivity, acquiring, disposing of and/or abandoning hydrocarbon resources, reviewing prior hydrocarbon management decisions, and any other hydrocarbon-related acts or activities. The term "hydrocarbon management" is also used for the injection or storage of hydrocarbons or CO2, for example the sequestration of CO2, such as reservoir evaluation, development planning, and reservoir management. In one embodiment, the disclosed methodologies and techniques may be used to extract hydrocarbons from a subsurface region. In such an embodiment, inputs are received from a subsurface model of the subsurface region, where a geologic model has been enhanced or created using the methods and aspects disclosed herein. Based at least in part on the representative subsurface model, the presence and/or location of hydrocarbons in the subsurface region are predicted. Hydrocarbon extraction may then be conducted to remove hydrocarbons from the subsurface region, which may be accomplished by drilling a well using oil drilling equipment. The equipment and techniques used to drill a well and/or extract the hydrocarbons are well known by those skilled in the relevant art. Other hydrocarbon extraction activities and, more generally, other hydrocarbon management activities, may be performed according to known principles. The process ends at block 120.

Beneficially, the multiple scenarios provide flexibility, such that various scenarios may involve a number much larger than currently possible because automated tools track of scenarios. These may even create other scenarios and provide for quick application of pointed modifications that may need to be propagated through a complex model. Further, the application of geologic concepts and flexibility in determining which concepts to use and how to add new ones provides an enhancement in modeling analysis. Also, the present techniques may involve sharing information among geoscientists, reproducibility of results, and general documentation.

FIG. 1B is a flow chart 150 for generating a subsurface model in accordance with another exemplary embodiment of the present techniques. As noted above, this flow chart 100 includes a data preparation stage, which includes blocks 102, 104 and 106, and an interpretation stage, which includes blocks 108 to 116. Further, the resulting subsurface model may be utilized to produce hydrocarbons as shown in block 118 and the process may be completed in block 120. In this embodiment, the pattern language may be used to specify geologic concepts, as shown in block 152. Beneficially, it allows the specification of geologic concepts; as such additional concepts become available. In other words, the human interpreter may elect to add (or remove) geologic concepts by describing them using the pattern language.

Figure 2:
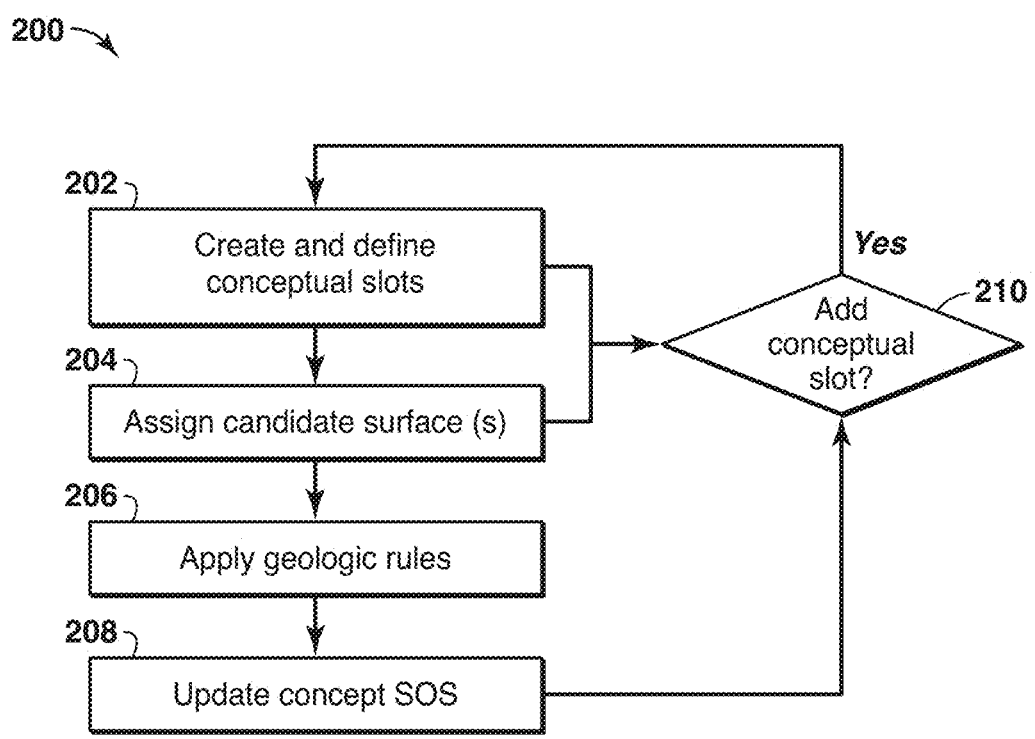
FIG. 2 is a flow chart for managing the concepts in accordance with an exemplary embodiment of the present techniques.
Figure 3:
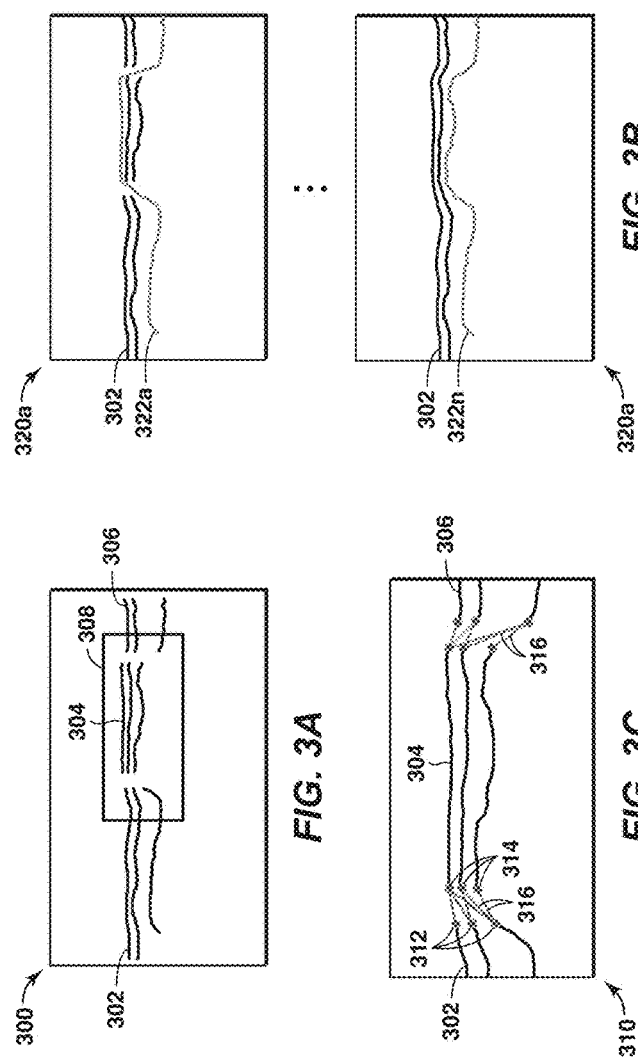
FIGS. 3A and 3B are exemplary graphs of a pattern specification in accordance with an exemplary embodiment of the present techniques.
FIG. 3C shows an exploded view from FIG. 3A.

While the geologic concepts may be managed through different methods, FIG. 2 is an exemplary flow chart in accordance with an embodiment of the present techniques. In this flow chart 200, the application of the geologic concepts, as noted in block 108, may include various stages of a conceptual framework manager.

At block 202, the conceptual slots are created and defined. The creation of the conceptual slots may include defining a tag or type for the slot—the conceptual horizon—a location of the slot relative to other slots. The definition of the conceptual slots may include assigning any properties that are independent of the horizon's geometry like a name, confidence, stratigraphic description, etc. Then, at block 204, candidate surfaces are assigned. The assignment of candidate surfaces may include assigning a geometric object that describes a horizon top to the slot, including making multiple such assignments and storing each one of them. The geometric object may be a reference or the explicit geometry (e.g., points and their coordinates). Then, at block 206, the geologic rules are applied. The application of the geologic rules may include truncating the selected candidates from the various conceptual slots according to the types of surfaces defined by the slot's description (e.g., an unconformity truncates a conformable surface). Then, the concept stack of surfaces (SOS) may be updated in block 208. The updating may include removing surfaces from the SOS, adding new surfaces, substituting surfaces, permuting surfaces, modifying the values for existing surfaces, changing their types, or combination thereof.

At block 210 a determination is made whether a conceptual slot should be added. This is a decision by a human interpreter or a computer interpreter. In either case, the decision pertains to what is expected from the data.

If a conceptual slot is to be added, then the process may proceed to block 202. However, if the conceptual slot is not to be added, the process may terminate or other processes may be engaged instead (like interpretation of additional candidates for existing slots).

Beneficially, this process may be utilized to enhance the model construction process. Creating a geologic framework—i.e. sets of horizons with geologic significance—is greatly facilitated by this flow because many of the otherwise manual tasks are being performed by the computer. The geologic rules, in particular, are also enforced by the system, thereby improving the consistency of the final interpretation product (the geologic framework).

As noted above in block 114 of FIG. 1, the pattern language may be utilized to enhance the interpretation of a subsurface model. FIGS. 3A, 3B, 4 and 5 provide graphs and a flow chart that provide further clarification of embodiments of the use of pattern language to enhance the process in accordance with exemplary embodiments. In particular, FIGS. 3A and 3B are exemplary graphs of a pattern specification in accordance with an exemplary embodiment of the present techniques.

As used here various terms are utilized to define hierarchical patterns and other aspects of the pattern language. For example, a pattern includes sub-patterns collected according to local neighborhood rules in a globally consistent manner. The three elements to a pattern specification are Primitives, Neighbor Relation, and Global Constraints, which are described in FIG. 3A.

Primitives, as used herein, mean either original measurements, such as attributes, dips, trends, curve segments, etc., or sub-patterns that are collected by this pattern. The primitives may include curves and seismic horizons.

Neighbor relation, as used herein, means a measurement of how primitives can be connected locally. This defines a graph in which nodes are primitives and an edge between nodes exists if the pair of primitives may be collected into a larger object (e.g., curve segments along a straight line may be pairwise connected). Collecting primitives into a larger object is represented by some function that transforms two objects into one object. But, the transformation does not have to be discrete (e.g., two curve segments may be combined into a longer segment (or curve) through spline fitting, interpolation or a high order polynomial fit). Further, any connected subgraph of primitives may be transformed by some function into a larger object. One of the features of the graph, as noted in FIG. 3A, is to provide for enumeration of possible configurations. Each potential pattern instance is a connected subgraph.

Global constraints, as used herein, mean conditions that are maintained after the primitives are collected. The neighbor relation graph, as noted in FIG. 3A below, identifies local affinities, but the final object, an instance of the larger pattern, may include selecting several of the edges and treating the result as a collection of patterns. This larger collection should be consistent according to some global constraints (e.g., a seismic horizon made up of small curve segments does not intersect other seismic horizons in the same data).

Thus, a pattern, as used herein, is a transformation of a collection of sub-patterns into a set of consistent pattern instances, wherein each of which is larger than a primitive sub-pattern. The result of such a transformation is not unique (e.g., a choice in one place may influence the decision at many other locations, and every selection at a given location may need to be explored). The result, then, is used to generate a number of distinct configurations, each of which is globally consistent and contains larger objects than those in the set of primitives. These candidate configurations include a consistent set of pattern instances, as noted further below in the FIG. 3B and the associated discussion, as an example.

As an example, FIGS. 3A and 3B are exemplary graphs of a pattern specification in accordance with an exemplary embodiment of the present techniques. These graphs (e.g., graphs 300 and 310 of FIG. 3A and 320$a$ and 320$n$ of FIG. 3B) may represent a carbonate platform. In the graph 300, different primitives, which are represented by the various green lines, such as green lines 302, 304 and 306, are different horizons within the graphs 300 and 310. (Due to patent law restrictions on the use of color, the drawings have to be black and white reproductions.) The green lines 302, 304 and 306 are not continuous and not connected to each other. FIG. 3C is an exploded view of part 308 in FIG. 3A. The red points, such as red points 312 and 314 represent the respective ends of the green lines, while the yellow lines, such as yellow lines 316, represent the possible connections between the green lines. The yellow lines are possible configurations or neighbors (e.g., how the primitives (green lines) may be linked locally). This platform may include two aligned and relatively vertical curves of similar length connected by a horizontal curve on top. In some embodiment, a platform must not overlap another platform of similar size and it must not be on top of another Platform of similar size.

The results of the pattern language is shown in the graphs 320a and 320n of FIG. 3B. Graphs 320a and 320n show several candidate configurations, which are represented by the yellow lines 322a and 322n. These candidate configurations are the pattern instances on which further analysis may be performed.

These candidate configurations (or pattern instances) may be provided as primitives into another pattern definition (e.g., curves become primitives of horizons or sequences). That is, a candidate configuration of one pattern or part of a candidate configuration may be utilized as the input (e.g., the primitives) of the next pattern. This is how the hierarchies of patterns can then be built.

Figure 4:
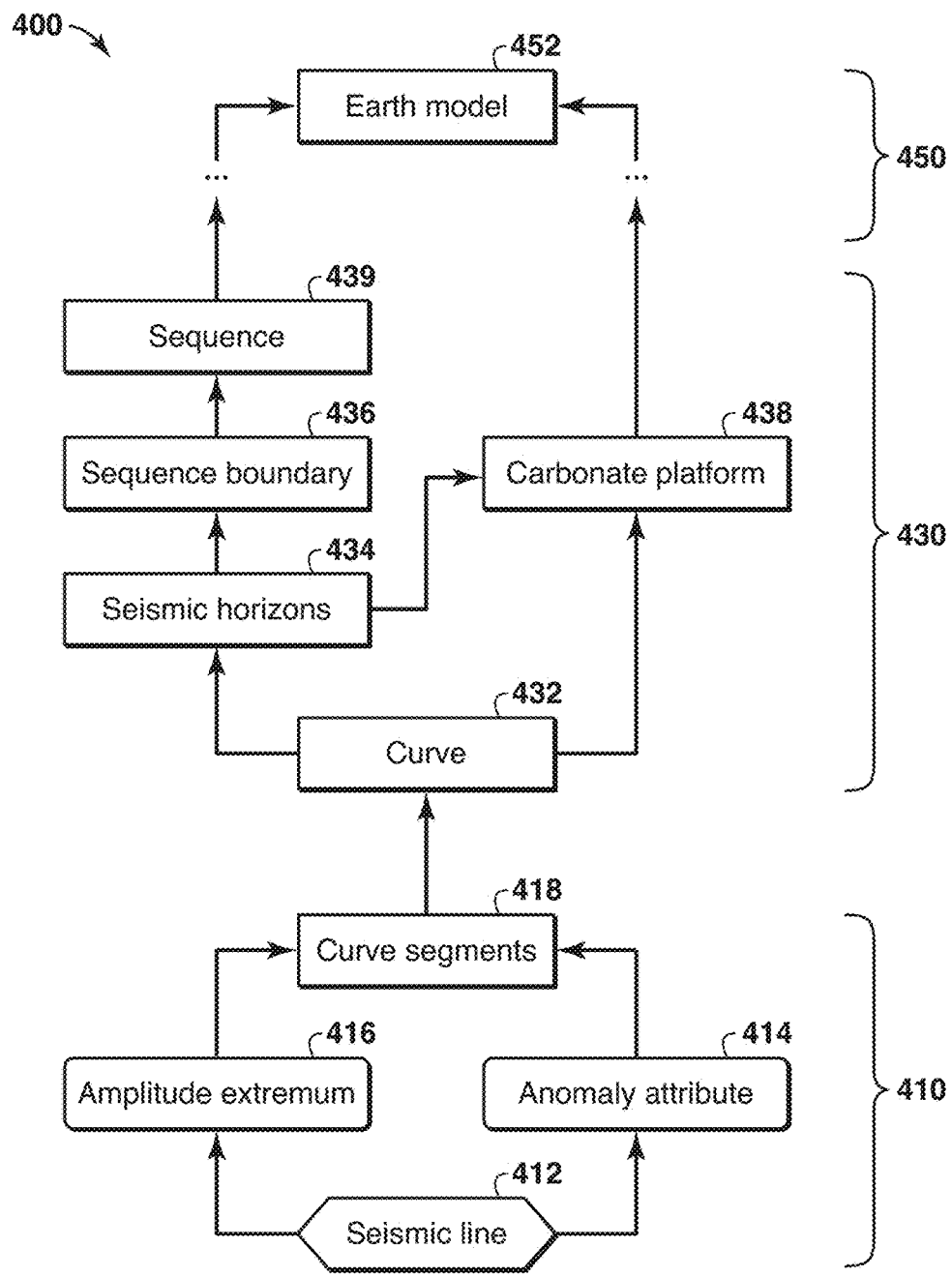
FIG. 4 is an exemplary flow chart of the pattern hierarchy with associated graphs in accordance with an exemplary embodiment of the present techniques.

As an example, FIG. 4 is a flow chart of a pattern hierarchy with associated graphs in accordance with an exemplary embodiment of the present techniques. For this flow chart 400, a pattern may include sub-patterns (e.g., primitives) collected according to their neighborhood rules in a globally consistent fashion. A pattern is a transformation of the data into candidate configurations, where each candidate configuration is a set of instances of the pattern. In particular, the flow chart 400 may include various stages of logic. For example, a lower-level logic stage 410, which may involve measurements and/or attributes, is represented by blocks 412, 414, 416 and 418, while an intermediate logic stage 430, which may involve captured expert knowledge, is represented in blocks 432, 434, 436, 438 and 439 along with graphs 440 and 442. The higher-level reasoning stage 450, which may involve interpreter interactions, is represented by block 452.

The lower-level logic stage 410 may involve capturing and modeling the attributes and/or measurements. In particular, a seismic line may be obtained as shown in block 412. The seismic line may be subjected to anomaly attribute calculations, as noted in block 414, and amplitude extremum calculations, as noted in block 416. These calculations may identify different portions of the seismic line that have different attributes. Then, with the attributes identified, curve segments may be formed, as shown in block 418.

The intermediate logic stage 430 may involve capturing expert knowledge based on the curve segments and/or attributes. At block 432, the curve segments may be utilized to identify curves. That is, the curve may be formed from curve segments, as part of the pattern hierarchy (see FIG. 6 for another example). The curves may then be provided to a seismic horizon calculation, as noted in block 434 or to a carbonate platform calculation, as shown in block 438. The seismic horizons may then be provided to the carbonate platform calculation, as shown in block 438, or may be subject to sequence boundary calculations, as noted in block 436, and then sequence calculations, as noted in block 439. Additional higher level logic 450 may be included that eventually combines all patterns into an Earth model, as noted in block 452.

The higher-level reasoning stage 450 involves interpreter interactions with an Earth model, as noted in block 452. The Earth model is one embodiment of a subsurface model that may be utilized to describe the subsurface region being represented by the model and associated with the measurement data.

The pattern hierarchy may be utilized to enhance interpretations.

As the basis of the pattern language, the primitives may be obtained through a variety of methods. For example, methods that involve tracking peaks or troughs (e.g., ridges) or extracting trends from seismic data, as noted in U.S. Patent Application Ser. Nos. 61/740,358; 61/740,352; 61/740,353; and 61/740,354, for example. These techniques can be used separately or in conjunction.

A specific example is provided in FIGS. 5A to 5C. FIGS. 5A to 5C are exemplary graphs 500, 510 and 520 of computing primitives and the neighbor relations graphs in accordance with an exemplary embodiment of the present techniques. In these graphs 500, 510 and 520, the ridges may be determined through a ridge finder technique. In graph 500, various curve segment primitives are obtained from ridge curves 502. Then, flow lines can be used as a guide to connect primitives without introducing too many connections, as shown in graphs 510 and 520. This ridge finder technique may be used to extract ridge curves in a seismic line, but the curves may link several reflection events and even overlap with each other. The extracted ridge curves are shown in FIG. 5C as bold lines 522. The curves may be divided at locations where the curves intersect to obtain curve segments and the connectivity graph is then inferred from the break points. However, all possible or desired connections between segments may not be captured in this manner. Accordingly, trend curves or the trend tensor fields may be calculated to connect disjointed primitives, while limiting the number of connections. This approach may be utilized to enhance interpretations in noisy data, where the ridge finder technique does not capture primitive connections reliably.

Regardless of the method utilized to compute a tangent field, the tangent field provides the basis for geometric pattern extraction. Each flow curve of the tangent field can be used to define both primitives and neighbor relations of a pattern. For example, a carbonate platform, such as the carbonate platform FIGS. 3A and 3B, can be extracted by selecting three seed points (e.g., the points 316), following the flow curves, and breaking them into curve segments where the curvature exceeds a certain threshold. The curve segments are the primitives depicted in FIG. 3A. Then, the neighbor relations can be obtained by following the flow, while limiting the deviations to a small change (e.g., a cone oriented by the tangent field).

More generally, patterns can be defined in terms of their geometric inter-dependencies by the use of path curves. A path curve is a parameterized curve along which predicates are evaluated. For example, the "left" and "right" may be made precise by defining a curve or vector that points to the right; then object A is to the right of object B if, starting at B and moving along the path curve, the object A is found. Similarly, "above", "below", "toward", "basinward" or other terms may be defined in a similar manner. A natural generalization of this aspect is a reference surface, where manipulations are associated or guided by that surface (e.g., area of interest delimited by top and bottom surfaces, as noted in U.S. Patent Application No. 2011/0048731, for example).

A path curve or a reference surface may be obtained from an original measurement, set manually, or derived from the relative location of identified patterns. For example, "basinward" may be computed either from a dip attribute over a large area or by finding clinoforms and locating the shelf edge. Both paths and reference surfaces are types of patterns.

The present techniques provide an adaptive framework that may utilize the output of pattern transformations as input data to for other patterns. That is, the patterns are transformations of the underlying data. As such, the output of a pattern (e.g., a candidate configuration) may be used as the underlying data from which more patterns are built. These patterns do not have to be part of the same hierarchy. For example, a first pattern (Pattern1) may include surfaces with anticlines and a second pattern (Pattern2) may include meandering channels on time slices. Then, a third pattern (Pattern3) may be defined to include meandering channels on anticlines by using the output of the first pattern (Pattern1) as input into the second pattern (Pattern2).

Figure 6:
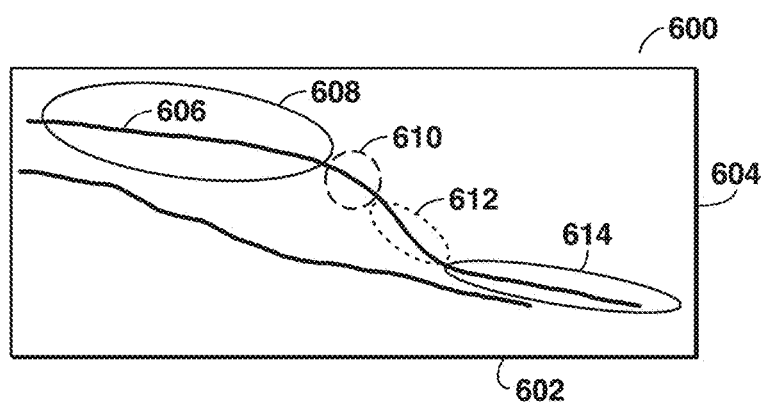
FIG. 6 is an exemplary graph of the output of one pattern to extract another pattern in accordance with an exemplary embodiment of the present techniques.

An example of this is shown further in FIG. 6. FIG. 6 is a graph 600 showing an 25 example of using the output of one pattern to extract another pattern in accordance with an exemplary embodiment of the present techniques. The graph 600 includes seismic data represented along a vertical axis 604 and a horizontal axis 602. Within the graph 600, a curve 606 is located using the iso-surface tensor field as an integral surface. To further specify meaning to this pattern, the curve 606 is broken into additional patterns (see Eqs. e5-e8): shelf 608, shelfedge 610, slope 612, and basin 614. This may be accomplished by applying further curvature analysis on the original Curve pattern—e.g. as exemplified by applying the detector functions Straight( ), HighCurvature( ) and DownDipping( ). Then, a clinoform pattern is assembled from these patterns by applying the geologic definition of the various parts of a clinoform surface—e.g. by specifying the patterns' relative positions to one another (see Eqn. e4). This is possible because the input and output types of the patterns are compatible. Accordingly, a type system in this pattern language can facilitate error checking as well as guide the specification of patterns.

Another example involves four-way closures. This pattern can be the conjunction of a first pattern Pattern1, which is an East-West anticline maximum, with a second pattern Pattern2, which is a North-South anticline maximum, to form the third pattern Pattern3, which is the four-way closure. The four-way closure is the locations where both the first pattern Pattern1 and the second pattern Pattern2 produce valid instances. The first pattern Pattern1 and the second pattern Pattern2 are substantially the same, but have a different path curves. The two path curves (e.g., East-West and North-South) may be selected along the principle directions of the surface patch at the location of interest. The definition of a pattern may change depending on the input patterns.

In general, the path curves can be seen as a parameter to a pattern definition. Thus, the same pattern may be applied in a variety of situations: along a straight line, along a flow curve, etc. In the above example, the parametric pattern along a path, such as initial pattern Pattern0(path-curve), which is the anticline maximum, may be defined. In this manner, the other patterns may be defined by the following equations as follows:

$$\text{Pattern1} := \text{Pattern0}(\text{East-West}) \tag{e1};$$

$$\text{Pattern2} := \text{Pattern0}(\text{North-South}) \tag{e2}; \text{ and}$$

$$\text{Pattern3} := \text{Pattern1 and Pattern2} \tag{e3}.$$

For other embodiments, more than one parameter may be used, such as in applications that include reference surfaces that delineate the top and bottom of a package (i.e. a region bounded by the two surfaces). Transformations of local parameters may be performed on certain types. For example, a parametric pattern may include a relative notion of left and right. As an example, rotating the path curve (e.g., to the left of the path) can be described as a rotation of the tangent by 90 degrees.

The result of the pattern transformations may be utilized as input data for other operations. That is, in this framework, patterns transform primitives into addressable data segments that follow a prescribed order. The data segments are themselves patterns, which may occur elsewhere in the data. However, the fact that the data segments are found in a precise combination that the collecting pattern dictates is useful information. For example, a Clinoform pattern may be defined by the following equations, where each of the data segments are substantially curves (see FIG. 6):

$$\text{Clinoform} := \text{Shelf followed\_by ShelfEdge followed\_by Slope followed\_by Basin} \tag{e4};$$

$$\text{Shelf} := \text{Straight}(\text{Curve}) \tag{e5};$$

$$\text{ShelfEdge} := \text{HighCurvature}(\text{Curve}) \tag{e6};$$

$$\text{Slope} := \text{Straight}(\text{DippingDown}(\text{Curve})) \tag{e7}; \text{ and}$$

$$\text{Basin} := \text{Straight}(\text{Curve}) \tag{e8}.$$

In isolation, these patterns may be identified in various locations in the data and along many types of curves. If the global constraints definition of Clinoform includes a rule that no overlap is permitted between curves, these four elements may appear in very few locations in the manner prescribed by the Clinoform pattern. In other words, identifying a ShelfEdge element that is a part of a Clinoform pattern is a different approach from identifying a ShelfEdge element on its own. The context that Clinoform pattern provides further clarifies the element. Accordingly, contextual patterns may be defined in this example by writing ShelfEdge:in:Clinoform. Thus, we can define the basinward direction as a pattern, as noted in the equation below:

$$\text{Basinward} := \text{ShelfEdge:in:Clinoform toward Basin:in:Clinoform} \tag{e9}.$$

In this equation, the word toward is analogous to followed\_by in the Clinoform definition. These are instructions that pertain to following a path curve or a vector. In Clinoform, the implicitly assumed path curve is used to define what follows what. In Basinward, a vector is defined between two patterns that have been identified. More specific directions, such as which part of the Basin to use in the vector calculation, may be obtained through pattern modifiers. These have been used to define the data segments in Clinoform. Straight( ), High Curvature( ) and Dipping( ), are further modifications of the basic pattern types that are not patterns but functions.

Functions, as opposed to patterns, produce a single predictable output that is a transformation of their input. Patterns, on the other hand, may produce more than one output (e.g., two or more candidate configurations, as noted in the discussion of FIGS. 3A, 3B and 4). As such, functions are a basic type of pattern. Moreover, functions may contain parameters that can be used for tuning.

Yet another example of contextual patterns is a basin floor fan. This is a typically a region juxtaposed to a clinoform, which starts at the intersection location or point of the top of the fan with the clinoform. This location is referred to as the ClinoformBasinFanIntersection. The basin floor fan BasinFloorFan may be defined as an integral part of the context that is provided by the ClinoformBasinFanIntersection in the below equations:

TopOfBasinFloorFan:=Curve (e10)

ClinoformBasinFanIntersection:=TopOfBasinFloorFan meets Slope:in:Clinoform or TopOfBasinFloorFan meets Basin:in:Clinoform (e11)

TopOfBasinFloorFan: =TopOfBasinFloorFan:in:ClinoformBasinFanIntersection (e12)

This particular definition may cause some issues. First, it introduces an unnecessary pattern type and it is incomplete. The pattern type TopOfBasinFloorFan is defined globally and visible everywhere, but it is only utilized with ClinoformBasinFanIntersection. Accordingly, scoping rules that regulate the life of a pattern type should be defined. As such, patterns defined in a file or a more generic pattern library at the top level are visible at any other level.

To address the problems in the definition, one or more operation may be utilized. For example, the Let construct provides a mechanism to define additional levels. The above definition becomes the following pattern definitions:

ClinoformBasinFanIntersection:=Let TopOfBasinFloorFan:=Curve in TopOfBasinFloorFan meets Slope:in:Clinoform or TopOfBasinFloorFan meets Basin:in:Clinoform (e13)

TopOfBasinFloorFan:=TopOfBasinFloorFan:in:ClinoformBasinFanIntersection (e14)

By comparing the previous definition in equations (e10 to e12) with the current definition in equations (e13 to e14), the scope of the definitions of TopOfBasinFloorFan are at different scoping levels. The first definition is not valid outside that pattern, except when referenced in that context, while the second definition of TopOfBasinFloorF an uses the context of ClinoformBasinFanIntersection to extract the appropriate pattern. Therefore, TopOfBasinFloorFan is never defined as some Curve as in the first example.

Pattern definitions may be considered as type definitions. Thus, a sequence of patterns substantially match the prescribed order if some instance of the sub-patterns is found in that order. However, it is also useful to specify patterns with respect to some fixed pattern. The basin floor fan example, which is noted above, is an example. In that example, the top of the basin floor fan is defined, but the whole pattern may be identified as the top, the bottom or any location between the top and bottom. Thus, the pattern may be defined with respect to the same clinoform: the top of the fan terminates against that clinoform, and the bottom of the fan is part of that clinoform. The instance modifier InstanceOf( ) provides a mechanism to refer to a fixed pattern instance.

AClinoform:=InstanceOf(Clinoform)

The label AClinoform for the instance modifier is analogous to a variable in an imperative programming language, but it differs fundamentally in its reach. It represents any instance of the Clinoform pattern, but when it is used in other pattern definitions, it refers to the same instance. Thus, AClinoform is an arbitrary, but fixed instance of the pattern Clinoform. By contrast, Clinoform simply represents the type of pattern. As such, two different Clinoform instances may be matched in the following pattern:

BasinFloorFan:=TopOfBasinFloorFan above Basin:in:Clinoform

The first instance of Clinoform is the one that provides the context to find the TopOfBasinFloorF an, and the second Clinoform instance is the one that gives the context for the Basin curve. If instead of Clinoform, AClinoform is used as defined above, then there is no ambiguity.

Certain recursive definitions of patterns may also be utilized. For example, a ClinoformPackage may be defined as two or more Clinoform patterns. Recursion may be utilized as follows in these equations:

ClinoformPackage:=Clinoform above Clinoform or Clinoform above ClinoformPackage (e15).

Two to n clinoforms can be expressed as:

ClinoformPackage:=Clinoform above Clinoform or Clinoform above ClinoformPackage[n] (e16).

where n specifies the maximum number of elements that the pattern may have.

To determine how many elements a given pattern has, the modifier NumberOf( ) may be defined that returns an integer. Hence, NumberOf(ClinoformPackage) may be returned as to how many sub-pattern instances are collected in the ClinoformPackage instance. Also, NumberOf(ClinoformPackage, Clinoform) specifies which sub-pattern instances to count. Note, however, that NumberOf(Clinoform:in:ClinoformPackage) may count the number of elements found in a Clinoform that is a part of a ClinoformPackage.

Specific instances may be addressed by the construct Clinoform:in:ClinoformPackage[x], and may loop over such instances. For example, the path curve may be defined to follow the shelf edge in a clinoform package, as noted in the pseudo flow below:

```
ClinoformStackingPath :=
    Let n:=2 to NumberOf(ClinoformPackage, Clinoform) in
        Let    PreviousClinoform :=
            Clinoform:in:ClinoformPackage[n−1] and
            NextClinoform := Clinoform:in:ClinoformPackage[n] in
                ShelfEdge:in:PreviousClinoform toward
                    ShelfEdge:in:NextClinoform
```

This pattern is a Curve (e.g., a path curve), which can be further analyzed and divided into progradational and aggradational horizon sets Each of these sets can then be used to extract the clinoforms that are a part of them and then define the highstand and lowstand regions as patterns.

The pattern definitions can be used as processing instructions directly. Therefore, a flexible pattern language (e.g., one that permits the same pattern to be specified in different manners) may provide a mechanism to explore efficiency questions while defining the patterns.

Exploring more than one candidate configurations automatically is this manner may be useful to provide multiple scenarios. This is beneficial with complicated or large patterns, where manual work (e.g., interpreter time) is required. Moreover, the formal system makes it possible to list all possible configurations, even though that may be impractical in some applications due to the large number of configurations that may be generated.

The patterns in this framework are not functions even though they transform their input data (e.g., the primitives). The output is the set of candidate configurations. Thus, executing the second pattern Pattern2 on the output of the first pattern Pattern1 involves two steps, which are (1) pick a candidate configuration C resulting from the first pattern Pattern1, and (2) execute the second pattern Pattern2 on candidate configuration C. One approach is to execute the second pattern Pattern2 on each of the candidate configuration of the first pattern Pattern1. In that case, the global constraints of the first pattern Pattern1 may provide a mechanism through which appropriate candidate configurations may be selected. However, the description may be augmented with a mechanism through which the candidate configurations may be ranked (e.g., size of pattern, location, parameters to an optimization scheme, etc.). This may also be part of the global constraint definitions.

The following table summarizes some basic and advanced elements of the pattern language.

| Basic elements of the pattern language (partial list) | |
| --- | --- |
| Reserved Words | Let, in, :in:, and, or |
| Basic Types | Nothing, Scalar (Integer, Float), Point, Vector, Curve, Surface RegionOf(X), ListOf(X) where X can be any type (basic or composite) |
| Basic Modifiers | InstanceOf( ); VectorFromPoints(P1, P2) DivergenceOfVectors(RegionOf(Vector)) -> RegionOf(Scalar) IntersectionOfCurves(Curve, Curve) -> RegionOf(Point) along_path(Curve), along_vf( RegionOf (Vector) ) |
| Math Operations on Curves | Curvature, Slope, Tangent, Normal, Straight(threshold), DippingDown(curve, threshold), DippingUp(curve, threshold), etc. |

Further, in one or more embodiments, the present techniques may be utilized to produce hydrocarbons from a subsurface region. This subsurface region may be represented by the vector volume, labeled volume and subsurface model, which may be generated in accordance with the embodiments noted above. For example, a method may include constructing a subsurface model via one or more of the various embodiments above. Then, the subsurface model may be utilized in hydrocarbon management activities to determine locations of resources, access the resources and produce hydrocarbons in a manner know to those skilled in the art. Disclosed aspects may be used in hydrocarbon management activities. As used herein, "hydrocarbon management" or "managing hydrocarbons" includes hydrocarbon extraction, hydrocarbon production, hydrocarbon exploration, identifying potential hydrocarbon resources, identifying well locations, determining well injection and/or extraction rates, identifying reservoir connectivity, acquiring, disposing of and/or abandoning hydrocarbon resources, reviewing prior hydrocarbon management decisions, and any other hydrocarbon-related acts or activities. The term "hydrocarbon management" is also used for the injection or storage of hydrocarbons or CO2, for example the sequestration of CO2, such as reservoir evaluation, development planning, and reservoir management. In one embodiment, the disclosed methodologies and techniques may be used to extract hydrocarbons from a subsurface region. In such an embodiment, inputs are received from a subsurface model or volume of the subsurface region, where the geologic model has been improved using the methods and aspects disclosed herein. Based at least in part on the subsurface model or volumes, the presence and/or location of hydrocarbons in the subsurface region is predicted. [Previous sentences should be edited to reflect subject matter of application.] Hydrocarbon extraction may then be conducted to remove hydrocarbons from the subsurface region, which may be accomplished by drilling a well using oil drilling equipment. The equipment and techniques used to drill a well and/or extract the hydrocarbons are well known by those skilled in the relevant art. Other hydrocarbon extraction activities and, more generally, other hydrocarbon management activities, may be performed according to known principles.

Persons skilled in the technical field will readily recognize that in practical applications of the disclosed methodology, it is partially performed on a computer, typically a suitably programmed digital computer. Further, some portions of the detailed descriptions which follow are presented in terms of procedures, steps, logic blocks, processing and other symbolic representations of operations on data bits within a computer memory. These descriptions and representations are the means used by those skilled in the data processing arts to most effectively convey the substance of their work to others skilled in the art. In the present application, a procedure, step, logic block, process, or the like, is conceived to be a self-consistent sequence of steps or instructions leading to a desired result. The steps are those requiring physical manipulations of physical quantities. Usually, although not necessarily, these quantities take the form of electrical or magnetic signals capable of being stored, transferred, combined, compared, and otherwise manipulated in a computer system.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present application, discussions utilizing the terms such as "processing" or "computing", "calculating", "determining", "displaying", "copying," "producing," "storing," "adding," "applying," "executing," "maintaining," "updating," "creating," "constructing" "generating" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the present techniques also relate to an apparatus for performing the operations herein. This apparatus may be specially constructed for the required purposes, or it may comprise a general-purpose computer selectively activated or reconfigured by a computer program stored in the computer (e.g., one or more sets of instructions). Such a computer program may be stored in a computer readable medium. A computer-readable medium includes any mechanism for storing or transmitting information in a form readable by a machine (e.g., a computer). For example, but not limited to, a computer-readable (e.g., machine-readable) medium includes a machine (e.g., a computer) readable storage medium (e.g., read only memory ("ROM"), random access memory ("RAM"), magnetic disk storage media, optical storage media, flash memory devices, etc.), and a machine (e.g., computer) readable transmission medium (electrical, optical, acoustical or other form of propagated signals (e.g., carrier waves, infrared signals, digital signals, etc.)).

Furthermore, as will be apparent to one of ordinary skill in the relevant art, the modules, features, attributes, methodologies, and other aspects of the invention can be implemented as software, hardware, firmware or any combination of the three. Of course, wherever a component of the present invention is implemented as software, the component can be implemented as a standalone program, as part of a larger program, as a plurality of separate programs, as a statically or dynamically linked library, as a kernel loadable module, as a device driver, and/or in every and any other way known now or in the future to those of skill in the art of computer programming Additionally, the present techniques is in no way limited to implementation in any specific operating system or environment.

As an example, a computer system may be utilized and configured to implement on or more of the present aspects. The computer system may include a plurality of processors; memory in communication with the processors; and a set of instructions stored on the memory and accessible by the processors, wherein the set of instructions, when executed, are configured to: obtain one or more subsurface volume; obtain an interpretation of the subsurface volume; define one or more one or more flexible geologic concepts; apply, by a computer system, one or more geologic concepts to the interpretation of the subsurface volume, wherein the one or more geologic concepts comprise one or more flexible geologic concepts; obtain a modified interpretation of the subsurface volume based upon the applied geologic concepts. In certain embodiments, the set of instructions may perform the different aspects in the methods noted above or the algorithm noted above.

Figure 7:
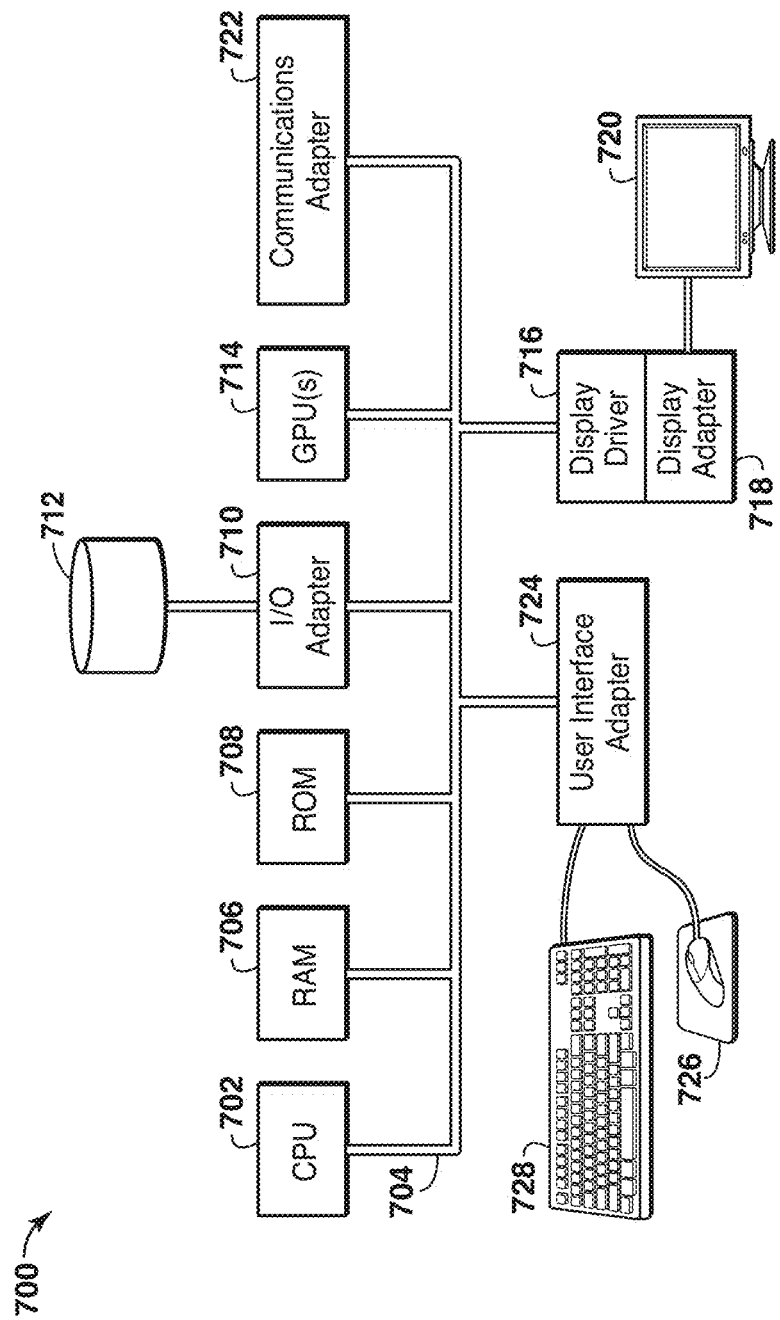
FIG. 7 is a block diagram of an exemplary computing system that may be used in exemplary embodiments of the present techniques.

As an example, the techniques discussed herein may be implemented on a computing device, such as that shown in FIG. 7. FIG. 7 shows an exemplary computer system 700 on which software for performing processing operations of embodiments of the present techniques may be implemented. A central processing unit (CPU) 702 is coupled to a system bus 704. The CPU 702 may be any general-purpose CPU. The present techniques are not restricted by the architecture of CPU 702 (or other components of exemplary system 700) as long as the CPU 702 (and other components of system 700) supports operations according to the techniques described herein.

The CPU 702 may execute the various logical instructions according to the disclosed techniques. For example, the CPU 702 may execute machine-level instructions for performing processing according to the exemplary operational flow described above. As a specific example, the CPU 702 may execute machine-level instructions for performing the methods of FIGS. 1 to 6B.

The computer system 700 may also include random access memory (RAM) 706, which may be SRAM, DRAM, SDRAM, or the like. The computer system 700 may include read-only memory (ROM) 708 which may be PROM, EPROM, EEPROM, or the like. The RAM 706 and the ROM 708 hold user and system data and programs, as is well known in the art. The programs may include code stored on the RAM 706 that may be used for modeling geologic properties with homogenized mixed finite elements, in accordance with embodiments of the present techniques.

The computer system 700 may also include an input/output (I/O) adapter 710, a 30 communications adapter 722, a user interface adapter 724, and a display adapter 718. The I/O adapter 710, user interface adapter 724, and/or communications adapter 722 may, in certain embodiments, enable a user to interact with computer system 700 to input information. Further, the computer system 700 may also include a graphical processing unit (GPU(s)) 714 to enhance the graphical processing of the computer system 700.

The I/O adapter 710 may connect the bus 704 to storage device(s) 712, such as one or more of hard drive, compact disc (CD) drive, floppy disk drive, tape drive, flash drives, USB connected storage, etc. to computer system 700. The storage devices may be used when RAM 706 is insufficient for the memory requirements associated with storing data for operations of embodiments of the present techniques. For example, the storage device 712 of computer system 700 may be used for storing such information as computational meshes, intermediate results and combined data sets, and/or other data used or generated in accordance with embodiments of the present techniques.

The communications adapter 722 is adapted to couple the computer system 700 to a network (not shown), which may enable information to be input to and/or output from the system 700 via the network, for example, the Internet or other wide-area network, a local-area network, a public or private switched telephone network, a wireless network, or any combination of the foregoing. The user interface adapter 724 couples user input devices, such as a keyboard 728, a pointing device 726, and a microphone (not shown) and/or output devices, such as speaker(s) (not shown) to computer system 700. The display driver 716 and display adapter 718 are driven by the CPU 702 to control the display on the display device 720, for example, to display information pertaining to a target area under analysis, such as displaying a generated representation of the computational mesh, the reservoir, or the target area, according to certain embodiments.

The present techniques are not limited to the architecture of the computer system 700 shown in FIG. 7. For example, any suitable processor-based device may be utilized for implementing all or a portion of embodiments of the present techniques, including without limitation personal computers, laptop computers, computer workstations, and multi-processor servers. Moreover, embodiments may be implemented on application specific integrated circuits (ASICs) or very large scale integrated (VLSI) circuits. In fact, persons of ordinary skill in the art may utilize any number of suitable structures capable of executing logical operations according to the embodiments. In one embodiment of the present techniques, the computer system may be a networked multi-processor system.

It should be understood that the preceding is merely a detailed description of specific embodiments of the invention and that numerous changes, modifications, and alternatives to the disclosed embodiments can be made in accordance with the disclosure here without departing from the scope of the invention. The preceding description, therefore, is not meant to limit the scope of the invention. Rather, the scope of the invention is to be determined only by the appended claims and their equivalents. It is also contemplated that structures and features embodied in the present examples can be altered, rearranged, substituted, deleted, duplicated, combined, or added to each other. The articles "the", "a" and "an" are not necessarily limited to mean only one, but rather are inclusive and open ended so as to include, optionally, multiple such elements.

What is claimed is:

1. A method of modeling the subsurface comprising:
    (a) obtaining one or more subsurface volume of geophysical or geological data;
    (b) obtaining an interpretation of the subsurface volume;
    (c) defining one or more flexible geologic concepts, wherein the flexible geologic concepts include a stacking pattern for how different surfaces interact when they meet and an interpolation operation for missing surfaces, and wherein a geologic concept is flexible when it is added by a user of the method on an as-needed basis employing a selected pattern language, the pattern language being computer implemented rules for combining multiple patterns in the subsurface volume, and a pattern being a feature extractable by a computer from the subsurface volume;

(d) applying, by the computer, the one or more flexible geologic concepts to the interpretation of the volume;

(e) obtaining a modified interpretation of the subsurface volume based upon the applied flexible geologic concepts, wherein a resulting subsurface model is obtained based on the modified interpretation of the subsurface volume; and (f) causing a well to be drilled at a location determined from the resulting subsurface model for producing hydrocarbons.

2. The method of claim 1, wherein the flexible geologic concepts are provided by creating and defining a plurality of conceptual horizons;

assigning candidate surfaces to the plurality of conceptual horizons;

applying geologic rules to the candidate surfaces to create a stack of surfaces.

3. The method of claim 2, wherein the stack of surfaces is updated by creating new conceptual slots or deleting defined conceptual horizons.

4. The method of claim 2, wherein the stack of surfaces is updated by changing the candidate surfaces.

* * * * *